(12) United States Patent
Etter

(10) Patent No.: US 6,407,567 B1
(45) Date of Patent: Jun. 18, 2002

(54) IC DEVICE BURN-IN METHOD AND APPARATUS

(75) Inventor: Phillip J. Etter, Austin, TX (US)

(73) Assignee: Advanced Micro Devices, Austin, TX (US)

( * ) Notice: Subject to any disclaimer, the term of this patent is extended or adjusted under 35 U.S.C. 154(b) by 96 days.

(21) Appl. No.: 09/606,752

(22) Filed: Jun. 29, 2000

(51) Int. Cl.[7] .............................................. G01R 31/02

(52) U.S. Cl. ..................................... 324/760; 324/158.1

(58) Field of Search .............................. 324/760, 158.1, 324/73.1; 714/724

(56) References Cited

U.S. PATENT DOCUMENTS

| | | | |
|---|---|---|---|
| 4,145,620 A | * | 3/1979 | Dice .......................... 324/73.1 |
| 5,390,129 A | * | 2/1995 | Rhodes ..................... 324/158.1 |
| 5,672,981 A | * | 9/1997 | Fehrman ..................... 324/760 |
| 5,796,246 A | * | 8/1998 | Poh et al. ................... 324/73.1 |
| 5,982,189 A | * | 11/1999 | Motika et al. .............. 324/763 |
| 6,160,411 A | * | 12/2000 | Eliashberg et al. ......... 324/760 |

* cited by examiner

Primary Examiner—Michael J. Sherry
Assistant Examiner—Jimmy Nguyen
(74) Attorney, Agent, or Firm—Richard F. Frankeny; Winstead Sechrest & Minick P.C.

(57) ABSTRACT

An IC device burn-in system and method where a burn-in test motherboard is configured with a circuit environment like a customer level system motherboard. A stress software program is executed in a test controller which controls operational parameters to each IC device as well as determining whether an IC device runs system code or Built In Self Test (BIST) code. Running system or BIST code causes self heating which elevates the temperature levels for each IC device. Individual cooling means comprising cooling fans or thermoelectric coolers are used to control IC device temperatures to a desired burn-in level and to set temperature profiles. The stress software program may also adjust other operational parameters to the IC devices during a burn-in cycle. During a system level burn-in test the IC devices may undergo individual burn-in operation parameter profiles depending on the IC device part number. Since the temperatures of the IC devices are controlled using self heating, other devices not being tested may undergo their normal field level environment.

18 Claims, 3 Drawing Sheets

IC DEVICE BURN-IN METHOD AND APPARATUS

TECHNICAL FIELD

The present invention relates in general to test systems for integrated circuits (ICs), and in particular, to IC stress systems employing burn-in stress methods to facilitate early product life failures.

BACKGROUND INFORMATION

Burn-in stress is a method where an IC device is subjected to stress level operating conditions for the purpose of accelerating early failures that may occur when the IC device is assembled in a product. Burn-in stress generally involves elevating the temperature of an IC device beyond normal operating conditions and electrically exercising the IC device. There have been at times two opposing philosophies relating to burn-in. One philosophy is that burn-in eliminates weak IC devices resulting in a remaining set of robust IC devices. In this philosophy, burn-in is done to improve reliability and quality of IC devices being manufactured or used. The military, medical, and avionics are industries that have employed burn-in for this reason. There is a second philosophy of burn-in testing which contends that stressing a group of IC devices may weed out weak IC devices but it also weakens the IC devices that do not fail and thus reduces the quality of the remaining IC devices. Practitioners of the second philosophy of burn-in sometimes prefer to use burn-in as a way to improve the manufacturing process of a particular IC device. IC devices are stressed to failure, the failures are analyzed, and the results of the analysis are used to modify the manufacturing process. Once the process is optimized, manufactured IC devices are no longer subjected to burn-in stresses.

If burn-in is done to improve the quality of surviving IC devices, burn-in stress may be required on all production IC devices. This results in the need for burn-in chambers where a large number of IC devices can be stressed at one time typically using the same stress parameter profiles. Special burn-in boards (stress motherboards) are used to facilitate this stressing. These burn-in stress chambers many times subject the entire stress motherboard to burn-in stress conditions including the circuit board and the support circuitry. Sometimes the electrical environment presented by these burn-in stress motherboards deviates considerably from the environment experienced in the field. If the IC device under stress is a processor chip, the additional support ICs necessary for the processor chip to operate may not be present in these prior art burn-in stress systems and therefore the processor chip undergoes stresses of burn-in within a non-application system circuit environment. Many traditional burn-in methods apply electrical stimuli to many IC devices simultaneously and thus the signal frequency is lower than the IC device would normally experience in a product environment.

It is desirable to operate an IC device with its normal support circuitry and normal operational modes as it ensures circuit nodes within the IC device are extensively exercised during burn-in. One of the features of burn-in stress is the elevation of the IC device operating temperature simultaneous with the IC device circuit nodes experiencing voltage transitions. The rate of the voltage transitions (operating frequency) on the circuit nodes of an IC device during burn-in also adds to burn-in stress levels and is important to accelerating early life failures.

While it may be desirable to burn-in particular IC devices, it may not be desirable for all the chips in its support chip set to undergo the same stress levels or profiles during burn-in. There is also a need for the burn-in environment to allow the IC devices being stressed to be maintained in a circuit environment like the one experienced in a product level application.

SUMMARY OF THE INVENTION

An IC device system level burn-in method and apparatus are disclosed which enable IC devices to undergo burn-in within a circuit environment like the one experienced in a product level application. A burn-in stress motherboard has sockets for multiple IC devices along with support chip-sets and a stress controller. A stress software program, executing on the controller, controls IC device voltage, temperature, and operating frequency. Each IC device under stress has an individual cooling means and corresponding temperature controllers. IC device temperature is elevated by self heating and controlled by the temperature controller which uses set point data from the stress software program. The IC devices execute system code or Built In Self Test (BIST) code during burn-in. Burn-in operational parameters are customized for each IC device under stress. A support chip-set coupled to an IC device provides field level circuitry to stress the IC device. The IC device system level burn-in does not stress any unessential components during stress of a particular IC device.

Multiple stress motherboards each with multiple IC devices may be grouped into larger stress systems. Since each stress motherboard has its own stress controller, each stress motherboard may have different IC device types. The parameter profiles and the stress sequences for the particular IC device parts are controlled by the stress software program and easily modified to accommodate different part numbers.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
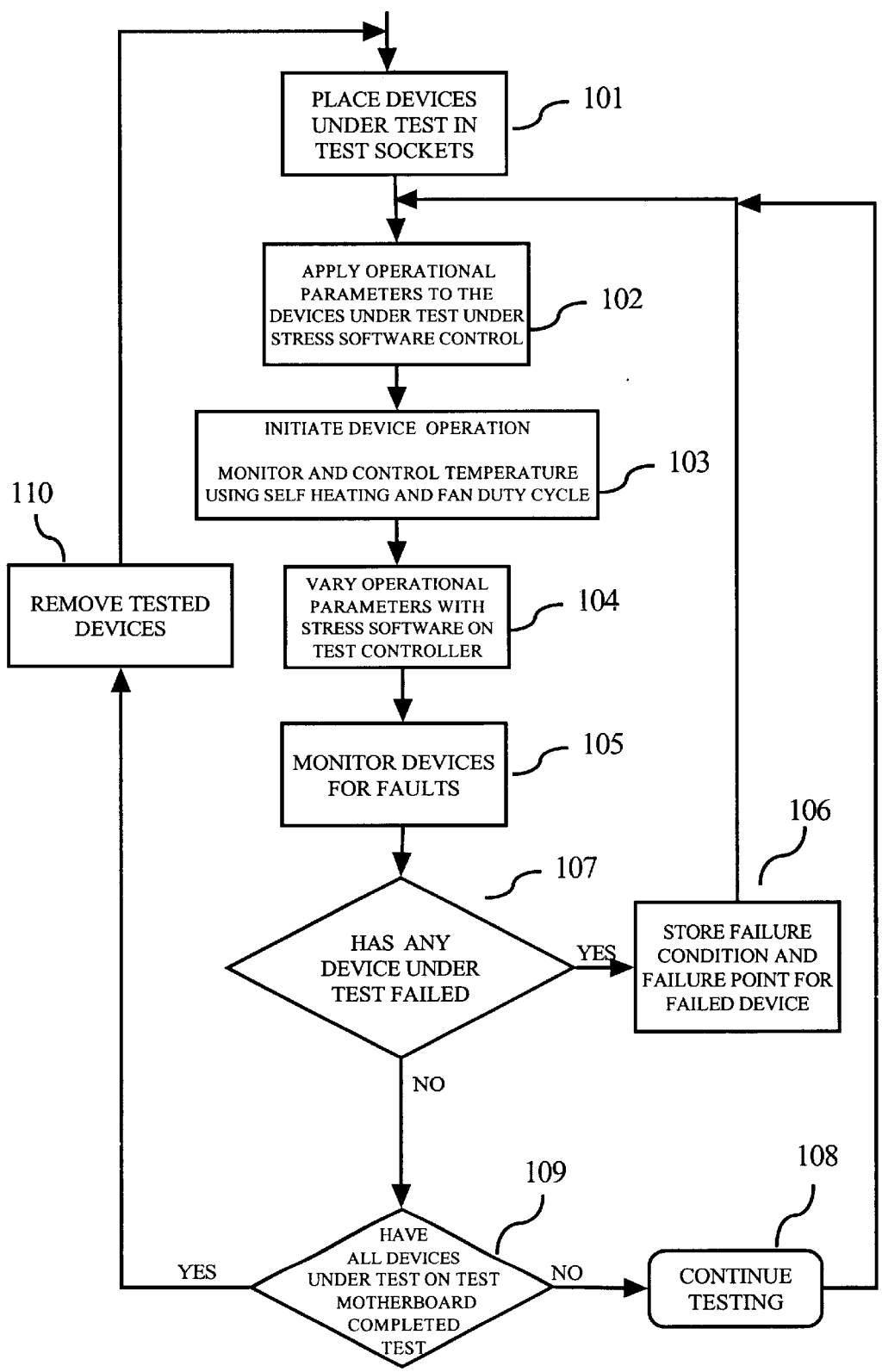
FIG. 1 is a flow diagram of method steps used in embodiments of the present invention.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details may have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 2:
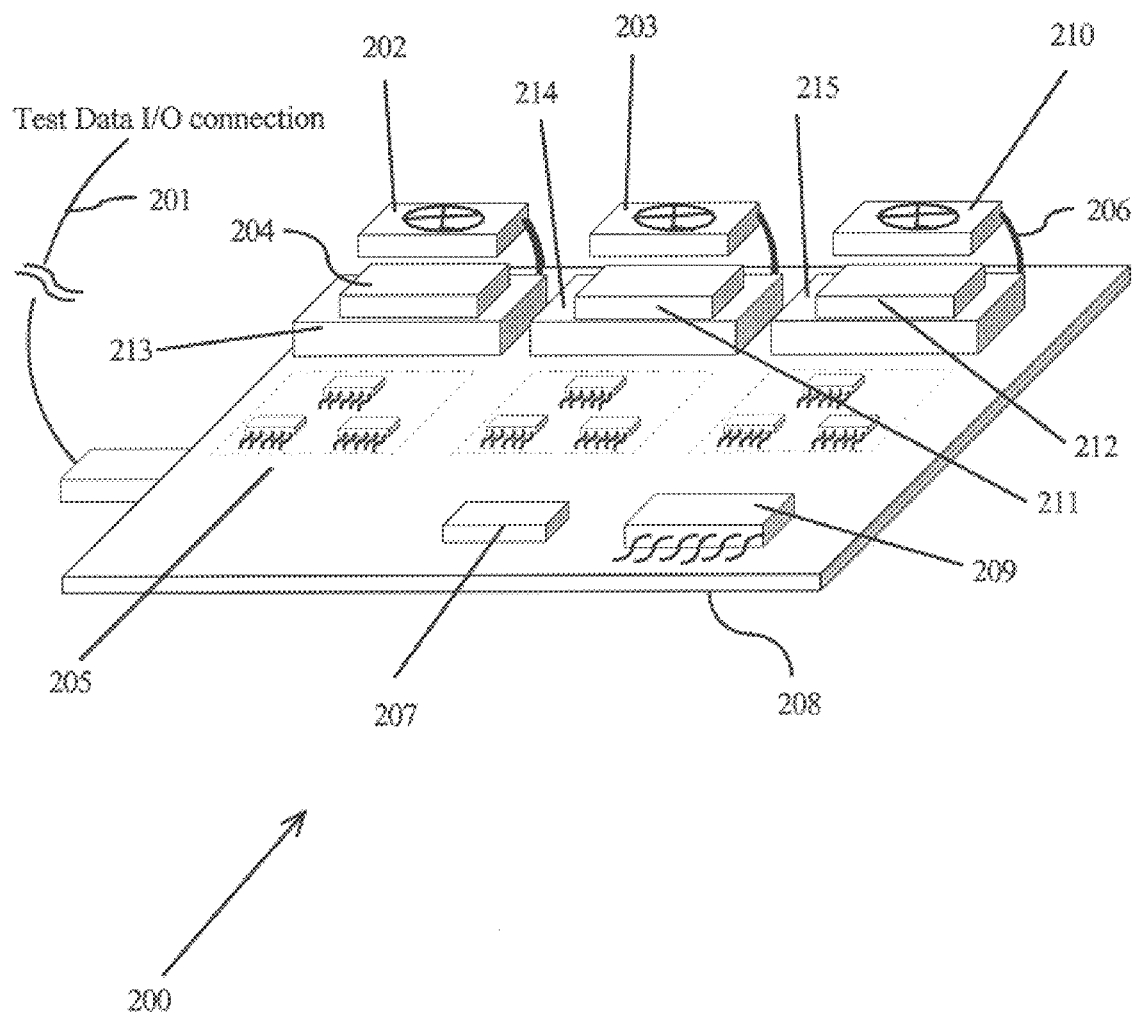
FIG. 2 illustrates an IC device system level burn-in motherboard where the IC devices are burn-in stressed according to embodiments of the present invention.

FIG. 2 illustrates an IC device burn-in assembly 200 comprising an IC device burn-in stress motherboard 208 populated with support circuits, sockets and individual IC device cooling fans. IC device burn-in stress motherboard 208 has burn-in IC devices 204, 211, and 212 inserted in sockets 213, 214, and 215 respectively. While only three burn-in IC devices 204, 211, and 212 are shown on the IC device burn-in stress motherboard 208, it is understood that embodiments of the present invention may have more or less than three burn-in IC devices under stress on an IC device burn-in stress motherboard 208. Each socket (e.g., 213, 214, and 215) has a temperature controller (not shown) used to measure and control the IC device temperature. Each burn-in IC device (204, 211, and 212) has a temperature control fan 202, 203 and 210 respectively. Each of these temperature control fans is coupled to its corresponding temperature controller (not shown) which controls the fan (202, 203, and 210) on/off duty cycle to maintain each IC device at its prescribed burn-in temperature. Since each of the IC devices 204, 211, 212 under stress have their temperature increased by self heating, each temperature controller (not shown) needs to only sense the temperature of its IC device and then turn the corresponding cooling fan on or off to establish a desired burn-in temperature or temperature profile. National Semiconductor Inc. located at 2900 Semiconductor Dr., Santa Clara, Calif., manufactures a temperature controller device, LM75, which may be used to sense temperature and control individual cooling fans 202, 203, 210 for the IC devices 204, 211, and 212. An exemplary support chip set 205 is used with each burn-in IC device (e.g., burn-in IC device 204). The exemplary chip set 205 provides a circuit environment for burn-in IC device 204 similar to that in a product level application. A stress controller 209 is included on each IC device burn-in stress motherboard 208. The stress controller 209 executes a stress software program which initiates IC device operation and thus self heating, controls operational parameters to selected profiles, monitors failures, and stores test results. A memory device (e.g., 207) is used to store programs or test data from a burn-in cycle. An exemplary test station I/O connection 201 is shown for coupling test data and program information to and from the exemplary IC device burn-in stress motherboard 208. In embodiments of the present invention the exemplary chip set 205 is coupled to two burn-in IC devices. In this embodiment, one of the burn-in IC devices may run system code while the other runs BIST code. System code may be code determined by the IC device architecture. For example, if the IC device is an IC processor, it may execute X86 system code. This embodiment more thoroughly stresses a burn-in IC device by ensuring more circuit nodes in the IC devices are exercised (IC devices run both system code and BIST code). Using one support chip set 205 for two burn-in IC devices also reduces the number of components on each IC device burn-in stress motherboard 208. Using one support chip set 205 for two burn-in IC devices has another advantage wherein the reduced loading of the support chip circuitry allows the frequency of applied signals to be higher than traditional burn-in methods. It should be noted that cooling means, other than fans (e.g., thermoelectric coolers), may be used and still be within the scope of embodiments of the present invention.

Figure 3A:
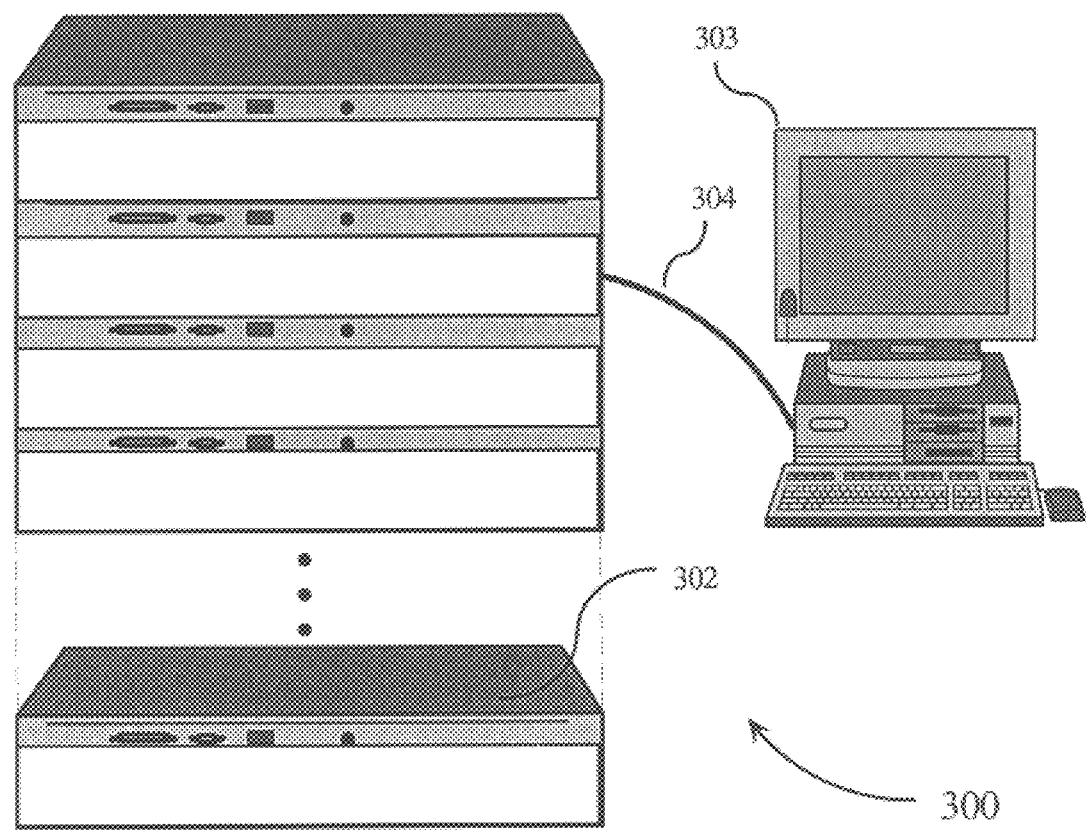
FIGS. 3A and 3B illustrate a burn-in stress cell comprising multiple burn-in drawers wherein each burn-in drawer contains a stress burn-in motherboard assembly.
Figure 3B:
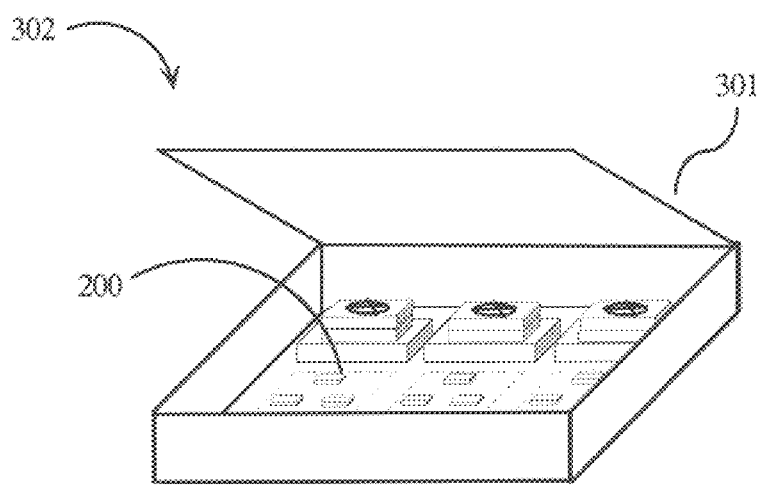

FIG. 3A illustrates a burn-in stress cell 300 comprising multiple burn-in stress drawers 302 and a PC system 303 for an operator interface to the stress cell 300. FIG. 3B illustrates a burn-in stress drawer 302 comprising a housing 301 and an IC device burn-in assembly 200 (see FIG. 2). Each burn-in stress drawer 302 is self contained and may be housed in racks with corresponding power and interconnections to make burn-in stress cells 300 which may contain varying numbers of burn-in stress drawers 302. A stress cell system cable 304 is used to couple test data to and from stress cell 300 and the individual burn-in stress drawers 302.

FIG. 1 is a flow diagram of method steps of embodiments of the present invention. In step 101, the IC devices 204, 211, 212 are placed into sockets 213–215 on the IC device burn-in stress motherboard 208. In step 102, the stress software program, executing in the stress controller 209, selectively applies operational parameters to the IC devices 204, 211, 212 under stress. In step 103, the stress controller 209 signals the support chips 205 and IC devices 204, 211, 212 under stress to execute routines that begin self-heating. Temperature controllers monitor each IC device temperature and controls corresponding cooling means 202, 203, 210 on each IC device 204, 211, 212 to maintain temperature profiles. In step 104, the operational parameters are varied by the stress software program over the duration of the burn-in cycle. The IC devices 204, 211, 212 are monitored for errors or failures in step 105. IC device failure is determined in step 107. If an IC device fails in step 107, the IC device failure condition and failure point are stored in step 106 and a branch to step 102 is executed where the burn-in cycle continues. The completion of a burn-in stress cycle is checked in step 109. If the burn-in stress cycle is not completed, stressing continues in step 108 with a branch back to step 102. If the burn-in stress cycle is completed in step 109, the burn-in stressed IC devices 204, 211, 212 are removed in step 111 and a branch back to step 101 is executed where new IC devices are inserted to start a new burn-in stress cycle.

Although the present invention and its advantages have been described in detail, it should be understood that various changes, substitutions and alterations can be made herein without departing from the spirit and scope of the invention as defined by the appended claims.

What is claimed is:

1. A method of system level burn-in of IC devices comprising the steps of:

coupling said IC devices with a support chip set using circuitry employed in a product level application environment;

elevating the temperatures of each of said IC devices employing self heating while said IC devices each execute test code;

controlling said temperatures of said IC devices by selectively cooling said IC devices;

setting operational parameters of said IC devices using a stress software program operating in a stress controller; and modifying said operation parameters to predetermined profiles by said stress software program.

2. The method of claim 1, wherein said operation parameters comprise voltage, operating frequency, and temperature.

3. The method of claim 1, wherein said IC devices are IC processors.

4. The method of claim 1, wherein said operational parameter profiles are predetermined based on a particular IC device part number.

5. The method of claim 1, wherein said IC device temperatures are controlled by adjusting the on/off duty cycle of corresponding individual IC device cooling fans.

6. The method of claim 1, wherein said IC device temperatures are controlled by controlling corresponding individual IC device thermoelectric coolers.

7. The method of claim 1, wherein said test code comprises system code and BIST code.

8. The method of claim 1, wherein said support chip circuitry operates up to one half of a product level frequency of said IC devices.

9. The method in claim 1, wherein said product level application environment comprises:
- a support chip set and couplings between said support chip set and the IC device at the same design level as a corresponding IC device assembled in a customer level system for a corresponding same application usage.

10. An IC device burn-in apparatus comprising:
- a burn-in stress motherboard, said burn-in stress motherboard comprising;
  - sockets for coupling IC devices undergoing burn-in stress to said burn-in stress motherboard,
  - a support chip set and circuitry for operating said IC devices in a product level application environment;
  - test circuits operable to selectively modify operational parameters applied to said IC devices in response to stress controller signals,
- test code executable on said IC devices which elevates said IC device temperatures by self heating;
- a stress controller operable to execute a stress software program and generate said stress controller signals, monitor faults conditions in said IC devices, and store stress programs and test results, said stress software program executable on said stress controller and operable to generate predetermined operational parameters profiles as stress controller signals; and
- individual cooling means for each of said IC devices, said cooling means operable to control said IC device temperatures.

11. The IC device burn-in apparatus of claim 10, wherein said operation parameters comprise voltage, operating frequency, and temperature.

12. The IC device burn-in apparatus of claim 10, wherein said IC devices are IC processors.

13. The IC device burn-in apparatus of claim 10, wherein said operational parameter variation profiles are predetermined based on a particular IC device part number.

14. The IC device burn-in apparatus of claim 10, wherein said IC device temperatures are controlled by adjusting the on/off duty cycle of corresponding individual IC device cooling fans.

15. The IC device burn-in apparatus of claim 10, wherein said IC device temperatures are controlled by controlling individual IC device thermoelectric coolers.

16. The IC device burn-in apparatus of claim 10, wherein said test code comprises system code and BIST code.

17. The IC device burn-in apparatus of claim 10, wherein said support chip and circuitry operates up to one half of a product level frequency of said IC devices.

18. The IC device burn-in apparatus of claim 10, wherein said product level application environment comprises:
- a support chip set and couplings between said support chip set and the IC device at the same design level as a corresponding IC device assembled in a customer level system for a corresponding same application usage.

* * * * *

UNITED STATES PATENT AND TRADEMARK OFFICE
CERTIFICATE OF CORRECTION

PATENT NO. : 6,407,567 B1
DATED : June 18, 2002
INVENTOR(S) : Phillip J. Etter

It is certified that error appears in the above-identified patent and that said Letters Patent is hereby corrected as shown below:

Title page,
Item [57], ABSTRACT,
Lines 1, 14 and 15, please replace "bum-in" with -- burn-in --.

Column 1,
Lines 6, 9, 16, 26, 34, 38 and 47, please replace "bum-in" with -- burn-in --.

Column 2,
Lines 10, 20, 46 and 47, please replace "bum-in" with -- burn-in --.

Column 3,
Lines 5, 12, 17, 59, 66 and 67, please replace "bum-in" with -- burn-in --.

Column 4,
Lines 2, 4, 7, 13 and 33, please replace "bum-in" with -- burn-in --.
Line 29, before "cycle" please replace "bum-in" with -- burn-in --.
Line 29, after "of a" please replace "bum-in" with -- burn-in --.

Signed and Sealed this

Twenty-fifth Day of February, 2003

JAMES E. ROGAN
*Director of the United States Patent and Trademark Office*